(12) United States Patent
Hanazawa

(10) Patent No.: US 11,785,712 B2
(45) Date of Patent: Oct. 10, 2023

(54) COMMUNICATION DEVICE

(71) Applicant: TARO06 LLC, Pacific Palisades, CA (US)

(72) Inventor: Kikka Hanazawa, Pacific Palisades, CA (US)

(*) Notice: Subject to any disclaimer, the term of this patent is extended or adjusted under 35 U.S.C. 154(b) by 250 days.

(21) Appl. No.: 17/322,023

(22) Filed: May 17, 2021

(65) Prior Publication Data

US 2021/0282261 A1    Sep. 9, 2021

Related U.S. Application Data

(62) Division of application No. 16/449,322, filed on Jun. 21, 2019, now Pat. No. 11,039,530.

(51) Int. Cl.

| | |
|---|---|
| *H05K 1/00* | (2006.01) |
| *H05K 1/18* | (2006.01) |
| *H05K 3/30* | (2006.01) |
| *H04L 12/28* | (2006.01) |
| *A41D 1/00* | (2018.01) |
| *A41D 13/12* | (2006.01) |
| *A61B 5/296* | (2021.01) |
| *A61B 5/316* | (2021.01) |
| *H05K 1/02* | (2006.01) |
| *H05K 7/14* | (2006.01) |
| *H05K 1/03* | (2006.01) |

(52) U.S. Cl.
CPC ......... *H05K 1/0277* (2013.01); *H05K 1/038* (2013.01); *H05K 1/18* (2013.01); *H05K 7/1427* (2013.01); *H04L 12/28* (2013.01); *H05K 2201/10098* (2013.01); *H05K 2201/10151* (2013.01)

(58) Field of Classification Search
CPC ............ H05K 1/00; H05K 1/18; H05K 1/189; H05K 1/038; H05K 1/0277; H05K 1/0283; H05K 3/30; H05K 3/281; H05K 3/361; H05K 2201/60; H05K 2201/10098; H05K 2201/10151; H04L 12/28; A41B 3/36; A41D 1/00; A41D 1/005; A41D 13/12; A61B 5/296; A61B 5/316; A61B 5/6804; A61B 5/6805; A61B 5/02055
USPC ............ 361/749; 428/91; 250/206; 345/168; 600/301, 546
See application file for complete search history.

(56) References Cited

U.S. PATENT DOCUMENTS

| | | | |
|---|---|---|---|
| 2016/0116778 A1* | 4/2016 | Kojima | G02F 1/133615 250/206 |
| 2017/0220162 A1* | 8/2017 | Ko | G06F 3/0443 |
| 2017/0325525 A1* | 11/2017 | Hyde | A61G 7/1051 |
| 2018/0338544 A1* | 11/2018 | Huang | H05K 1/0283 |
| 2019/0298987 A1* | 10/2019 | Freeman | A61N 1/3904 |

* cited by examiner

Primary Examiner — Xiaoliang Chen

(57) ABSTRACT

Disclosed herein are communication devices and connected clothing systems. The communication devices comprise a circuit printed on a portion of fabric, the circuit comprising means for transmitting electrical signals to and from a user, a controller electrically pairable to the circuit, and means for attaching the circuit to an item of apparel. Connected clothing systems comprises a communication device as disclosed herein attached to an item of apparel.

20 Claims, 14 Drawing Sheets

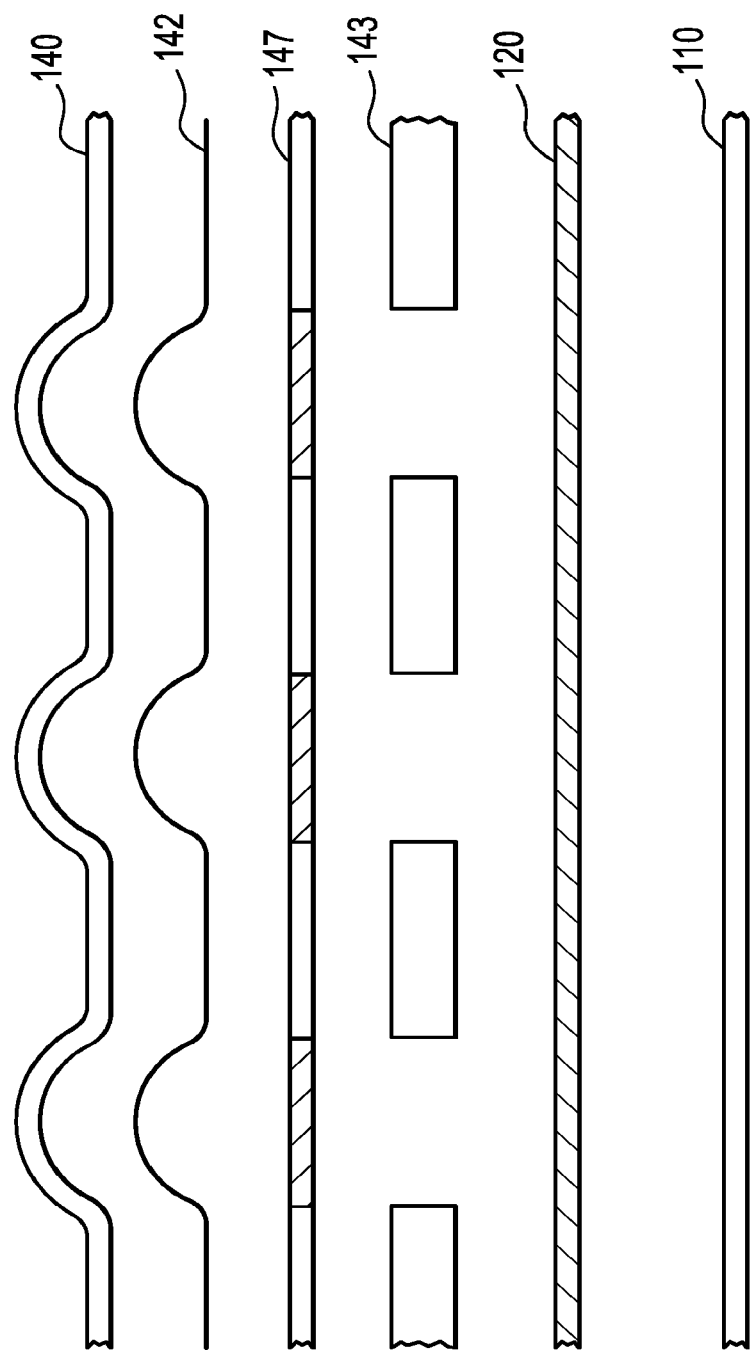

FIG. 8A
FIG. 8B
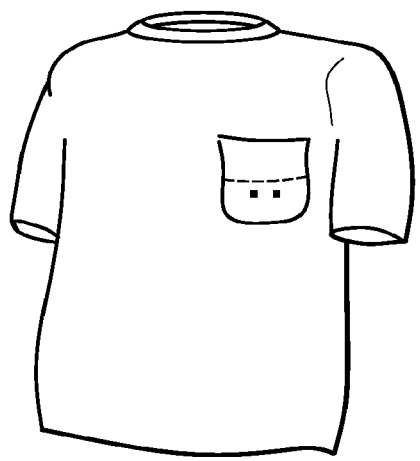
FIG. 9A
FIG. 9B
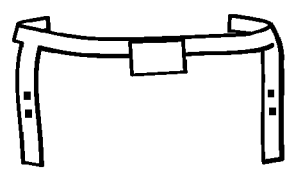

COMMUNICATION DEVICE

CROSS-REFERENCE TO RELATED APPLICATIONS

The present application is a divisional of U.S. utility patent application Ser. No. 16/449,322, titled "COMMUNICATION DEVICE," filed Jun. 21, 2019, which is incorporated by reference herein in its entirety.

BACKGROUND

Communication devices have become an integral part of our daily lives. People use these devices to communicate with each other and other devices across networks in a variety of contexts. Our world has become thoroughly connected, and communication devices have enabled us to facilitate communities, establish relationships, obtain and share information, and provide for our safety, and well-being.

SUMMARY

The inventor has recognized a need for clothing technology that enables people to intuitively and economically interact with smart technology such as electronic devices that we use in our daily routines. The inventor also envisions clothing technology, as described herein, that enables people to gain access to biometric data leading to more productive, fulfilling, and healthy lives. The simple innovative device described herein enables convenient connected clothing for everyone such that people can intuitively and economically interact with smart technology, gain access to biometric data, and lead more productive, fulfilling, and healthier lives.

The inventor has discovered a communication device for communicating between a clothing article and an electronic device wherein the communication device, in various embodiments, is in a convenient attachable/detachable form, printed on fabric, and versatile in its capacity to be implemented on a wide variety of sites on clothing articles and/or fashion accessories.

In some embodiments, described herein is a communication device and system that provides for convenient communications from an item of apparel to and from electronic or computing devices such as cell phones, home security systems, music systems, laptop and desktop computers, tablets, and the like. The communication device, in various embodiments, is attachable to an item of apparel and comprises a circuit printed on a portion of fabric and a controller electrically pairable to the circuit for communicating with electronic devices and computing devices. The communication device is designed to be attached to an item of apparel and in some embodiments the communication device can be attached to or incorporated into a lining of an item of apparel, or other convenient place for sending or receiving signals. In various embodiments, the communication device is implemented with items of apparel by being attached to regions that are unobtrusive such that the user can send or receive electronic communications without being noticed by other people. In some embodiments, the communication device is attached to an item of apparel such that the communication device is not visible or noticeable such that it can be used discreetly.

In some embodiments, the communication device can generate sensor stimuli in response to communications from electronic devices or computing devices, accept stimuli from a user to generate communications with an electronic device, or generate and accept stimuli to facilitate communications to and from an electronic device and a user. Any transmittable sensor stimuli can be used such as a tactile sensation, vibration patterns, lights, sounds, or combinations thereof such that a user wearing the communication device can receive and transmit notifications and other informational signals.

One advantage contemplated by the inventor is that the user can keep the communication device and electronic device, such as a smartphone, out of sight but still be alerted if there is a communication of which the user should be aware. Such communications can include, for example, phone calls, text messages, emails, calendar alerts, social media updates, and the occurrence of a lost or stolen phone.

In some embodiments, the communication device can be programmed and/or designed to communicate with a smartphone. A user can generate a signal by touching the apparel in a way that engages the communication device to transmit signals. This is accomplished, in some embodiments, by interacting, or engaging, with one or more sensors. In some embodiments, the user interacts with, or engages, sensors by interacting with a sensor identification region of the communication device. In some embodiments, the sensor identification region can be detected on the apparel by touch.

Various codes, or ways of touching the communication device, can generate different signals or messages, sending, for example, information or instructions for actions to one or more devices, to locate a phone, control music, or control lights.

In some embodiments the communication device described herein has the advantage of improving users' experiences with their phones by improving users' abilities to receive information from and transmit information to their phones without being in the vicinity of those phones.

In some embodiments, provided herein is a communication device comprising a circuit on a portion of fabric comprised of conductive lines and means for transmitting electrical signals to and from a user, a controller electrically pairable to the circuit the controller capable of communicating with an electronic device, and means for attaching the circuit to an item of apparel. In some embodiments, the circuit is printed on the portion of fabric. In some embodiments, provided herein is a communication device comprising a circuit on a portion of fabric comprised of conductive lines, means for transmitting electrical signals to and from a user, a controller electrically pairable to the circuit for communicating with an electronic device, and means for attaching the circuit to an item of apparel. In some embodiments, the conductive lines are conductive ink. In some embodiments, the conductive lines are conductive thread. In some embodiments, the conductive ink is part of an integrated layer, applied to, or encompassed by, the portion of fabric. The integrated layer comprises dielectric insulation, conductive ink, and thermoplastic polyurethane and is referred to, in various embodiments, when applied to the portion of fabric as an amalgamated flexible circuit region. The circuit printed on a portion of fabric comprised of conductive lines, ink, thread, or combinations thereof, and comprising means for transmitting electrical signals to and from a user is also referred to herein as a "sensing circuit" for convenience of usage.

In some embodiments, the means for transmitting electrical signals with a user comprises means for generating electrical signals.

In some embodiments, the communication device further comprising input means which are operably connected to the means for transmitting electrical signals. In some embodiments, the input means is a touch pad. In some embodiments, the touch pad is a fabric touch pad.

In some embodiments, the means for transmitting electrical signals comprises a switch for generating different signals, such as, for example, two or more on/off signal settings.

In some embodiments, the means for transmitting electrical signals is selected from a switch, sensors, antennas, biosensors, touch screens, a switch pad, a touch pad, touch switches, printed heaters, or combinations thereof.

Sensors can be, in various embodiments, pressure sensors, capacitive sensors, temperature and/or body sensors, motion sensors (such as an accelerometer, gyroscopes, force, tilter or vibration, and the like), environmental sensors (such as moisture, humidity, dust, or gas sensors), ultrasonic sensors, image sensors, heartbeat sensors, pulse sensors, GPS sensors, GSM sensors, NFC sensors, GPS sensors and modules, GSM sensors and modules, NFC sensors and modules, or combinations thereof.

In some embodiments, the means for attaching the circuit printed on the portion of fabric to an item of apparel is a magnet, a zipper, snaps, magnetic snaps, Velcro, buttons, or combinations thereof.

In some embodiments, the controller is detachable from the sensing circuit.

In some embodiments, the controller is attached to the sensing circuit by one or more pogo pins, magnets, a zipper, snaps, magnetic snaps, Velcro, buttons, or combinations thereof.

In some embodiments, the conductive ink is silver conductive ink. In some embodiments, the conductive ink is covered with a dielectric ink. In some embodiments, the conductive ink is covered by conductive material selected from conductive thread, silver, carbon, silver chloride inks, or combinations thereof. In some embodiments, the conductive ink is covered by a dielectric insulator layer. In some embodiments, the conductive ink is covered by a dielectric insulator layer and integrated with thermoplastic polyurethane and printed on the portion of fabric. The conductive ink covered by a dielectric insulator layer and integrated with thermoplastic polyurethane is referred to, in some embodiments, as an amalgamated flexible circuit region.

In some embodiments, the fabric is a textile. In some embodiments, the fabric is flexible.

In some embodiments, the controller comprises a power source, a microprocessor, and a network interface. In some embodiments, the network interface comprises an antenna. In some embodiments, the controller is a flexible printed circuit board.

In some embodiments, the circuit of the communication device is attached on the item of apparel interior, exterior, as a lining, as a sleeve, or combinations thereof.

In some embodiments the communication devices described herein can receive or transmit to electronic devices, computing devices, or communication devices known in the art including ordinary mobile phones, smartphones, communications networks, home appliances, television, audio or entertainment systems, security systems, laptops, cameras, tablets, desktop computers, home automation systems, other remote transmitting devices or telecommunication devices known in the art, or combinations thereof.

In some embodiments, the controller communicates through network technologies such as, for example, a local-area-network (LAN), wireless local-area-network (WLAN), network personal-area-network (PAN), such as Bluetooth, low power wide area (LPWA), contactless local area communication, wide-area-network (WAN), the internet, point to point networks, peer to peer networks, an intranet, infrared communication, ZigBee, Z-wave, Lor/SigFox, NB-IoT technologies and combinations thereof.

In some embodiments, the communication device comprises a circuit printed on a portion of fabric comprised of conductive ink and means for accepting electrical signals, a printed controller board, and means for attaching the communication device to an item of apparel. In some embodiments, the circuit printed on a portion of fabric comprises an amalgamated flexible circuit region which comprises a dielectric insulator layer, conductive ink lines, and thermoplastic polyurethane. In some embodiments, the conductive ink lines can be printed on thermoplastic polyurethane and then transferred as a set to the portion of fabric by heat transfer. In some embodiments, conductive ink lines and dielectric insulating ink are printed together on thermoplastic polyurethane and then heat transferred to the portion of fabric to form the amalgamated flexible circuit region of a circuit printed on a portion of fabric.

The communication device, described in some embodiments herein, is printed on lining type fabric, detachable from its wearer's clothing, and in some designs, is attached to a jacket sleeve, jacket pocket, shirt sleeve, pants, patent leggings, raincoat, outerwear, shirt, tee shirt, jacket, bra, dress, women's top, vest, children's apparel, or any location that could be designed to achieve a user's needs and/or goals.

In most embodiments, a user of the communication device described herein is a human.

The communication device is in some embodiments designed to communicate with a smartphone. Instructions can be sent from the smartphone to the communication device and from the communication device to the smartphone. Users can, for example, generate a signal by touching the apparel item to engage the means for transmitting electrical signals of the communication device, the signal can be received by the smartphone to provide, for example, a message, instructions, or an alert. Communicating with smartphones, or other devices, by sending information or instructions for actions, can be a programmable application in some embodiments.

In some embodiments, described herein, the communication device improves users' experiences with their phones and electronic devices by improving their abilities to receive information from and transmit information to their phones and/or other devices without being in the vicinity of those phones and/or other devices.

It is to be understood that both the foregoing summary and the following detailed description are exemplary and explanatory only and are not restrictive of the scope of the invention, as claimed, and described in various embodiments herein.

BRIEF DESCRIPTION OF THE DRAWINGS

FIG. 1D illustrates a cross section of the elements of the communication devices and an outer clothing fabric that in some embodiments covers the communication device;

FIG. 8A shows an embodiment of the communication device described herein for use with a shirt;

FIG. 8B shows the communication device of FIG. 7A without the presence of the shirt;

FIG. 9A shows an embodiment of the communication device described herein for use with a pair of pants;

FIG. 9B shows the communication device of FIG. 8A without the presence of the pair of pants;

DETAILED DESCRIPTION

Figure 1A:
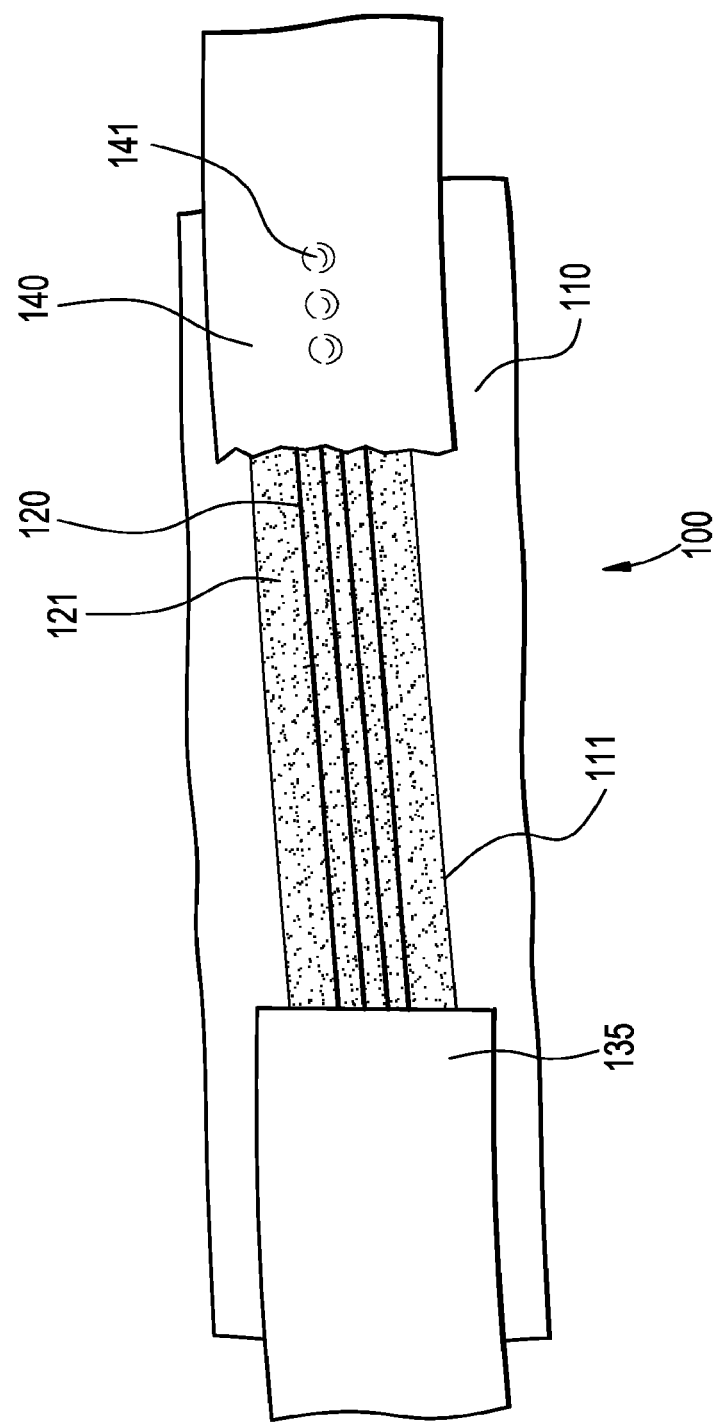
FIG. 1A shows a communication device in accordance with some embodiments described

Provided herein, in some embodiments, is a communication device comprising a circuit printed on a portion of fabric comprised of conductive lines and means for accepting electrical signals, a controller electrically pairable to the circuit for communicating with an electronic device and means for attaching the circuit printed on the portion of fabric to an item of apparel. The communication device when paired with a wide variety of apparel provides a connected clothing system that facilitates interactions with electronic devices and computing devices known to person of skill in the art.

As used herein, the term "means for transmitting electrical signals" comprises, in general, in various embodiments, electrical signal interfaces and, in various embodiments, refers to ways in which signals can be received and/or accepted by a user or generated by a user for communication with electronic and computing devices. In some embodiments, the means for transmitting an electrical signal to, or from, an electronic device, comprises one or more input means, such as an input device. An input device, in some embodiments can be a touch pad. In some embodiments the input means is a fabric touch pad. Various other input means can be used in some embodiments described herein including, for example, manual switches, buttons, touchscreens, and devices that measure skin conductions. Persons of skill in the art understand other variations on how electrical signals are transmitted and those described herein are illustrative. In some embodiments, the communication device uses information directly by sensing the touch of a user, in the absence of any manual switches, buttons, or touch pads, using a touch sensitive circuit.

In various embodiments an antenna is the means for transmitting electrical signals. The controller of the communication device, in some embodiments, comprises an antenna capable of transmitting electrical signals. Electronic devices in some embodiments comprise one or more antenna for transmitting electrical signals. Antennas, in various embodiments, convert electric signals to radio waves for transmitting (as a transmitter) and convert radio waves to electric signals (as a receiver). Persons of skill in the art understand that the means for transmitting electrical signals and means for receiving electrical signals can be, in various embodiments, a transmitter or receiver, respectively.

As used herein the terms "circuit printed on a portion of fabric", "circuit", "the circuit", and "sensor circuit" are used interchangeably and all refer to the circuit printed on a portion of fabric element of the communication device. Printed, as used herein, refers to the circuit adhering to or laminated with the fabric, and doesn't necessary imply the means by which the circuit was applied to and adheres to the portion of fabric, or inner fabric, as described in various embodiments herein.

As used herein, the "circuit printed on a portion of fabric" comprises a printed circuit. The circuit printed on a portion of fabric comprises conductive lines made of ink or thread. The circuit printed on a portion of fabric comprised of conductive lines is prepared using methods known in the art. In some embodiments, the circuit printed on a portion of fabric comprises a pressure sensor, or sensor, region and a connector region, whereby the pressure sensor region is configured to receive input and accept output and is operably connected to the controller which is, in various embodiments, in the connector region. In some embodiments, the circuit printed on a portion of fabric comprises conductive lines, a dielectric insulator layer, sensors, and a connector for electrically connecting the circuit to a controller. In some embodiments, the conductive lines are conductive ink. In some embodiments, the conductive lines are conductive thread. In some embodiments, the dielectric insulator layer is dielectric insulator ink. In some embodiments, the connectors are pogo pins. In some embodiments the connectors are magnets. The connectors provide, in various embodiments, an electric connection between the controller and the circuit printed on a portion of fabric. Connectors known to person of skill in the art can be used if they provide an electric connection between the controller and the circuit and connect the controller to the circuit. Persons of skill in the art understand that connectors can be varied in accordance with design choices. In various embodiments, the controller can be enclosed within a casing and the connector connects the casing to the circuit printed on a portion of fabric. In various embodiments, the controller is completely enclosed in the casing so that it is not visible. In various embodiments the casing has a closeable opening for introducing and/or removing the controller. In some embodiments the closeable opening comprises a zipper. In some embodiments, the closeable opening comprises hook-and-loop fasteners, hook-and-pile fasteners, or touch fasteners can be used to open and close the casing.

The circuit printed on a portion of fabric (also referred to herein as "printed circuit") can be prepared by methods known in the art. In some embodiments, conductive ink and dielectric insulating ink can be printed on thermoplastic polyurethane and the thermoplastic polyurethane can then be used to heat transfer, or laminate, the conductive ink and dielectric insulating ink to the fabric by methods understood by persons of skill in the art.

In some embodiments, the circuit printed on a portion of fabric comprises a conductive fabric, layered on a fabric to which it is fused, a dielectric insulator layer, and conductive ink. In some embodiments, conductive thread is sewn over the fabric to reinforce the conductive ink. In some embodiments, the circuit printed on a portion of fabric comprises conductive fabric layered on a fabric to which it is fused, a dielectric insulator layer, and conductive ink, printed on a portion of fabric can be laminated with thermoplastic polyurethane, or other suitable laminate.

In some embodiments, the dielectric insulator layer is comprised of dielectric insulating ink. In some embodiments, dielectric insulator coatings known to persons of skill in the art can be used to prepare the dielectric insulator layer.

The portion of fabric on which the circuit is printed can be any piece of fabric that is capable of being attached to an item of apparel. In some embodiments, the portion of fabric is a textile. In some embodiments the fabric is an artificial leather.

In various embodiments, the region of conductive fabric printed on the portion of fabric is comprised of a dielectric insulator layer and a conductive ink or thread. In some embodiments, the circuit printed on a portion of fabric is stretchable and flexible. The circuit printed on a portion of fabric can, in some embodiments, maintain connectivity and function while undergoing stretching and flexing that apparel is ordinarily subjected to.

In some embodiments, the communication device comprises a controller enclosed in a casing, a conductive layer, a fabric spacer, a circuit printed on a portion of fabric comprising conductive ink or threads, one or more sensors, and connectors that can connect the circuit to the controller, and an inner fabric. In some embodiments, the communication device further comprises a sensor indication molding region. The sensor indication region provides raised structures or protruding regions that indicate the presence of the sensors on an outer clothing garment in a sensor indication region. The sensor indication molding can be comprised of any suitable molding material, such as plastic or silicone. The sensor indication molding can, in some embodiments, provide the structure that enables a user to recognize at a touch the location of the communication device sensor region when it is attached to an item of apparel. The communication device in some embodiments can be covered by an outer fabric of a clothing garment. In some embodiments, a user of the communication device can recognize a sensor indication region of the garment by touching the garment, or outer clothing fabric, wherein the structure from the sensor indication molding provided by the sensor indication molding can be felt through the garment, or other outer fabric. Various conductive inks can be used in accordance with different embodiments of the communication device. Various conductive fabrics and conductive fabric fused to fabric can be used in preparing the circuit that is printed on a portion of fabric in some embodiments in accordance with methods known to persons of skill in the art. In some embodiments, the conductive ink is silver conductive ink. The conductive ink, in various embodiments, is stretchable and designed for printing on fabric. In some embodiments, the conductive ink is covered by, or integrated with or within, a dielectric insulating ink, i.e., dielectric insulator. The circuit printed on a portion of fabric can be prepared, in some embodiments, in accordance with methods known in the art. The circuit printed on a portion of fabric, in various embodiments, is stretchable and flexible.

The controller in various embodiments described herein, communicates signals from the circuit printed on a portion of fabric to electronic devices and can receive signals from the electronic devices and transmit them to the circuit using systems, networks, and circuits, such as integrated circuits, that are known by persons of skill in the art.

Controller, as used herein, can also comprise the term "microcontroller" as understood by persons of skill in the art. The controller, in some embodiments, comprises a microprocessor and battery. The controller, in some embodiments, can communicate, or interface, to and from various electronic devices, or computing devices, using various technologies such as, for example, a local-area-network (LAN), wireless local-area-network (WLAN), network personal-area-network (PAN), such as Bluetooth, low power wide area (LPWA), contactless local area communication, wide-area-network (WAN), the internet, point to point networks, peer to peer networks, an intranet, infrared communication, ZigBee, Z-wave, Lor/SigFox, NB-IoT technologies and combinations thereof. BaseStations in some embodiments can be an LTE BaseStation, a Lora/SigFox BaseStation, or other similar BaseStations known in the art.

The controller serves to communicate signals from a user from inputs into the circuit printed on a portion of fabric to an electronic device or computing device and receives signals from an electronic device or computing device and communicates them to a user through a sensing region on a circuit printed on a portion of fabric. The controller, in various embodiments described herein, is implemented with circuitry configured to detect touch signals from the sensor region. In some embodiments the controller is integrated into the fabric of the communication device. In some embodiments the controller comprises a printed circuit. The controller, in some embodiments, is electrically pairable with the circuit for communicating with the electrical devices. In some embodiments, the controller comprises a motor connected within the circuit for generating vibrations to alert users of an incoming signal. A variety of motors can be attached to the circuit in the controller in accordance with methods well known in the art. In some embodiments, the motor can create vibrational signals for the user. When the controller receives a communication from, for example, an electronic device, the information received in the communication can produce a stimulus such as a vibration by changing the voltage and thereby causing a tactile stimulus to be generated.

In some embodiments, the controller comprises software and storage so that it can remember the electronic device with which it is paired. The communication device may be unpaired through software on the telecommunication device as well, eliminating the connection between a communication device and a mobile phone and/or smartphone. This process of pairing can, for example, be implemented through a single button or click option. Those skilled in the art understand that software required to implement the systems, methods, and devises disclosed herein may vary, in order to work with different operating systems and programming languages.

As used herein, the term "electrically pairable" refers to the capacity of the controller to process both incoming and outgoing signals to facilitate communications between the communication device and various electronic devices, or computing devices, whereby the communication device can thereby be used to send signals to electronic devices or computing devices and receive signals from electronic devices or computing devices.

In some embodiments, the controller is powered by a battery. In some embodiments the battery is an ordinary coin battery. In some embodiments, more powerful batteries are associated with the controller, such as a 12 mAh battery. A wide variety of batteries can be used provided that they fit the device. Rechargeable batteries are used in some embodiments. Single use batteries are used in some embodiments. Examples of batteries that can be used in some embodiments include, but are not limited to, lithium cell, silver oxide, and alkaline cell batteries. In some embodiments, bio energy can be used to generate power for the controller. Bioenergy can be obtained by utilizing the movements of a user.

Data or signals can be communicated through the controller from input means on the circuit printed on a portion of fabric. As used herein, "input means" includes any means for communicating signals from the user to the controller via the circuit printed on a portion of fabric. Input means, in a sensor array, or sensor, region of the sensing circuit, are configured in various embodiments, to sense multi touch input signals from users, primarily by use of one or more fingers, hands, or swipe gestures. The sensing circuit input means are configured to sense touch inputs and transmit the information from the touch to the controller. Input means can include, for example in some embodiments, input pins on the printed circuit, a keyboard, a keypad, a mouse, a touch-screen, a touch-pad, a track-ball, a stylus, or any other suitable pointing device or input device that can be integrated with the communication device in accordance with practices and processes known to persons of skill in the art. In some embodiments input means comprises a fabric touch pad wherein signals are transmitted via touching the pad through the circuit to the controller that is configured to detect and transmit signals.

In some embodiments, the controller comprises a flexible printed circuit board. Various materials known in the art can be used in these embodiments that maintain the form of the printed circuit board such that expansion and contraction can be limited, and function maintained.

The communication device described in some embodiments herein can comprise an antenna or a plurality of antennae. In some embodiments, the antenna is partially or completely housed within a communication device, for example, within the casing for the controller, in accordance with embodiments described herein and can be configured to receive and optionally to transmit communications to an electronic device through accompanying network communication systems such as, for example, a local-area-network (LAN), wireless local-area-network (WLAN), network personal-area-network (PAN), such as Bluetooth, low power wide area (LPWA), contactless local area communication, wide-area-network (WAN), the internet, point to point networks, peer to peer networks, an intranet, infrared communication, ZigBee, Z-wave, Lor/SigFox, NB-IoT technologies and combinations thereof.

In some embodiments, the communication device and connected clothing systems described herein can be wirelessly connected to devices in a user's home, such as smoke alarms, animal collars, security systems, home appliances, computer peripherals, lights, HVAC systems, audio visual systems, or other such home devices in order to receive alerts of changes or to allow a user to communicate with his or her environment remotely. Additionally, in some embodiments, the devices and systems disclosed herein can include special emergency communications capabilities that directly contact proper emergency and help individuals in case of an accident. For example, an accelerometer may detect information that indicates whether a user has fallen.

As used herein, the term "connected clothing system" refers to the communication device described herein attached to, or embedded with, an item of apparel. As used herein, the terms item of apparel, garment, and clothing are used interchangeably and are well understood by persons in the clothing or fashion industries to have synonymous meanings. In the plural, the terms items of apparel, garments, and clothing are generally used.

As used herein, the term "sensing circuit" refers to a circuit printed on a portion of fabric comprised of conductive ink and/or thread and means for transmitting electrical signals to and from a user. The communication devices described herein in various embodiments comprise a sensing circuit.

The connected clothing system as described herein in some embodiments can interface with any existing technology that can be used with the communication device, as described in various embodiments herein.

This connected clothing system in some embodiments described herein uses "apparel as an interface" by attaching the communication device, as described herein, to certain parts of clothing, and establishing a system whereby touch, to the designated parts of clothing in which the communication device is embedded, or to which it is attached, will transmit communications to perform functions defined, or determined, by the user. Such functions include, for example, advancing a music track, answering a call, reading the next in a series of turn-by-turn directions, turning on lights, sending a pre-programmed text message, placing a phone call, and/or sending a message for help.

In some embodiments, the communication device as described herein enables the integration with sensor technology to measure various biometric data, such as heart rate, temperature, blood pressure, and the like, and can transmit that data for analysis or data gathering.

The communication device, in some embodiments, is modular, removable, or easily transferred, such that it can be easily moved from one garment to another and/or enable components to be easily replaced or upgraded.

The communication device can be used in a variety of ways by apparel manufacturers in industries such as consumer, fitness, medical, or military to add connectivity and sensors to clothing in a way that provide convenience and function in achieving industry goals.

The communication device and connected clothing system as described herein in some embodiments can provide added functionality to apparel improving the performance of garments and enhancing life experiences from a fashion, convenience, and biometric perspective.

In some embodiments, the communication devices described can be integrated with artificial intelligence and evolve to provide better solutions and receptivity to user habits and needs over time.

There are many applications of the communication device described herein and connected clothing systems that use the communication device. Some illustrative examples are provided here in a non-limiting way. For example, a connected clothing system can be embedded in children's clothing together with a GPS that can transmit location to parents. A panic button can alert parents and/or authorities in the case of emergency. In a sports and fitness context, a connected clothing system can be embedded in sportswear and enable users to control music and/or their phone without having to pull out a device and "break stride," and sensors can gather and transmit data to enable optimization of performance and prevention of injury. In the healthcare context, a connected clothing system can be combined with sensors to gather and transmit biometric data to doctors for patients in a variety of situations such as gathering baseline data, monitoring patients' post-surgery, or for eldercare.

In some embodiments, the communication device and connected clothing system described herein can be used in an artificial intelligence and/or predictive medicine context. Potential applications include, for example, applying data gathered by a connective clothing system to analysis by artificial intelligence. Such analysis can, in some embodiments, alert users to potential issues with safety or medical concerns before human operators would have the opportunity to recognize them.

In the navigation context, the communication device can be used to read next in series of turn-by-turn directions so that a driver, cyclist, etc., does not need to lose focus, as the case with current smartphone-based navigation. In various embodiments, simply by tapping the communication device discreetly attached to an item of apparel in a connected clothing system on the sleeve, pant leg, or hood, for example, can enable the navigation system interface.

In some embodiments, the communication device can be used for emergency situations. The communication device, in accordance with some embodiments described herein, can be attached or connected with underwear, such as a bra or tee shirt, which would enable a user to discreetly send a signal, phone call, text message, or record voice or video, in an emergency situation such as an assault or other threat.

In some embodiments, the communication device is useful in work contexts. For example, the connected clothing systems described herein can enable workers to remain in touch without the need for smart phones which could impair productivity.

Some embodiments of the communication device described herein can be used in military contexts. For example, sensors from some embodiments of the communication device described herein can gather and transmit data to monitor the health and fitness of soldiers in the battlefield and to establish baseline health and biometric data on soldiers that can be used as benchmarks.

In elder care, the connected clothing system described herein, in some embodiments, can be used to monitor and transmit biometric data to friends and family as well as provide a way for users to communicate or call for help easily in the event of mishap.

In some embodiments, the communication device as described herein, can be used to control environmental conditions in a home or office context. For example, tapping an interface of the communication device can enable the device to interact with smart home or office controllers to, for example, turn on/off music, lights, HVAC, alarm, alert a user of text or phone call from preprogrammed list by, for example, vibration. Another tapping input of a connected clothing system can, for example, send a preprogrammed message, answer a call, or send a recorded message.

Various embodiments of the communication device described herein are illustrated in the figures.

FIG. 1A shows a communication device 100 in accordance with some embodiments described herein. The communication device comprises a portion of fabric 110, or inner fabric 110, on which a circuit is printed, i.e. a circuit printed on a portion of fabric 111. The communication device comprises a circuit printed on a portion of fabric 111 comprises, in some embodiments, conductive lines 120, a dielectric insulator 121 and a casing 135 that encloses a controller. The controller is not shown in FIG. 1A. The casing 135 can, in some embodiments, be fabric, silicone, or other suitable material. A sensor identification region (or input region) 141 on an outer clothing fabric 140 covers input means of the communication device (not shown in FIG. 1A) that can include sensors or switches.

Figure 1B:
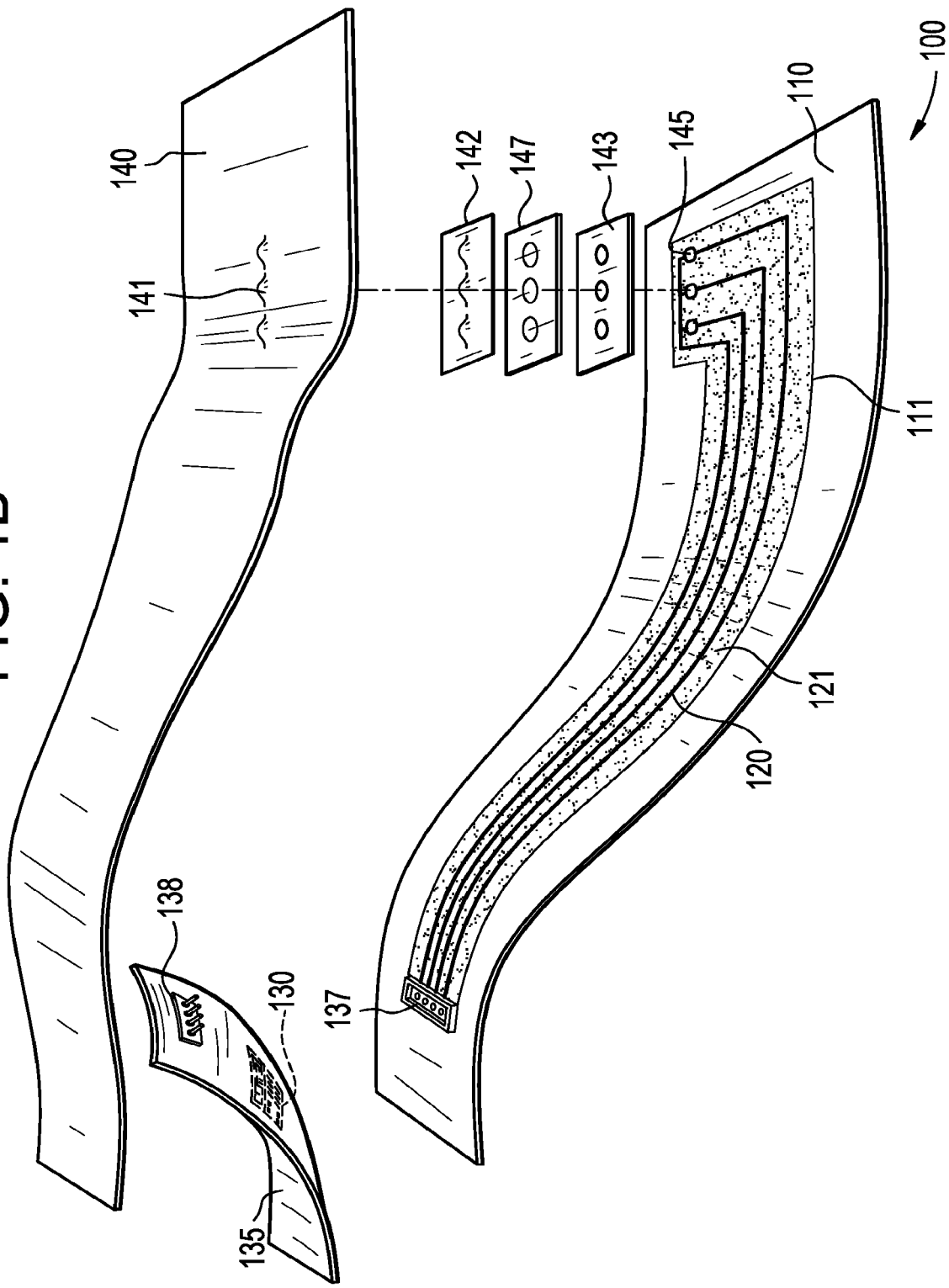
FIG. 1B shows a communication device in accordance with some embodiments described herein illustrating elements of a region of the circuit printed on a portion of fabric where signal inputs can be entered, a controller in a casing with its connection to the circuit printed on a portion of fabric, and an outer clothing fabric.

FIG. 1B shows further details of the communication device in accordance with some embodiments. In FIG. 1B the casing 135 is lifted up to illustrate how the casing can be used to connect with the circuit 111 printed on a portion of fabric, in various embodiments, by connectors 137 on the circuit and 138 from the casing 135. The broken lines in FIG. 1B at the underside of the casing 135 and to 130 illustrate schematically a controller 130 that is enclosed by the casing 135 and is not, in various embodiments, visible with the communication device. The controller 130 can be operably connected to the circuit 111 by connectors 137 and 138. The controller and casing can be attached to the circuit printed on a portion of fabric 111 by connectors 137 and 138 wherein the connectors 137 and 138 make electrical contact between the controller and the circuit 111 when attached. In FIG. 1B, the connectors are pogo pins 138 and a pogo pin mating region (or receptacles) 137, but a variety of connectors can be used, such as magnets, snap connectors, or any means known in the art for establishing an electrical connection while making the physical connection between the controller and the circuit. Also illustrated in FIG. 1B is an outer clothing fabric 140. The outer clothing fabric 140 represents a garment that the communication device can be used with in a connected clothing system. In some embodiments, as illustrated in FIG. 1B, the communication device 100 and outer clothing fabric comprises a connected clothing system comprising a sensor identification region 141 on the outer clothing fabric 140. FIG. 1B illustrates that sensors 145 of the circuit printed on a portion of fabric 111 can, in some embodiments, enable communication with the sensor identification region 141 on the outer clothing fabric through a sensor identification molding 142, a conductive layer 147 comprised of conductive material, a fabric spacer 143, and a controller 130 connected with the circuit printed on a portion of fabric by connectors 137 and 138. The circuit printed on a portion of fabric 111, as shown in FIG. 1B, is comprised of conductive lines 120, a dielectric insulator 121, a connector 137, sensors 145, and a portion of fabric 110, also referred to as an inner fabric 110 to distinguish it from the outer clothing fabric 140 that represents the fabric of a garment used with the communication device 100.

Also shown in FIG. 1B are elevations, a sensor identifier region 141, on the outer clothing fabric 140 that can, in some embodiments, provide a region that a user can recognize by touch. This elevation(s) on the outer clothing fabric, sensor identification region (or input region) 141, can be of a variety of different shapes in accordance with different embodiments. Whether the outer fabric is straight, flat, ridged, or other shape, is made possible by the sensor identification molding 142 which can be adapted to various shapes in accordance with designer and/or user preferences. The sensor identification molding 142 for forming a touch identifier region, sensor identification region 141, can, in some embodiments, be pressed through the spacer fabric 143 allowing conductive layer 147 to be touched to sensors 145 connected to conductive lines 120 in the sensor region printed on inner fabric or lining 110. Conductive contact can, in some embodiments, be made in this way from the sensor identification region 141 to the sensors 145. Various signaling combinations can be made, in various embodiments, from the sensor identification region to the sensors by discrete sensor inputs. As illustrated in FIG. 1B, a line indicates the conductive signal that can be sent by a user from the middle elevation of the sensor identification region 141 to the middle sensor 145. While three sensors 145 are shown in FIG. 1B, more or less sensors can be used, in various embodiments, described herein.

Figure 1C:
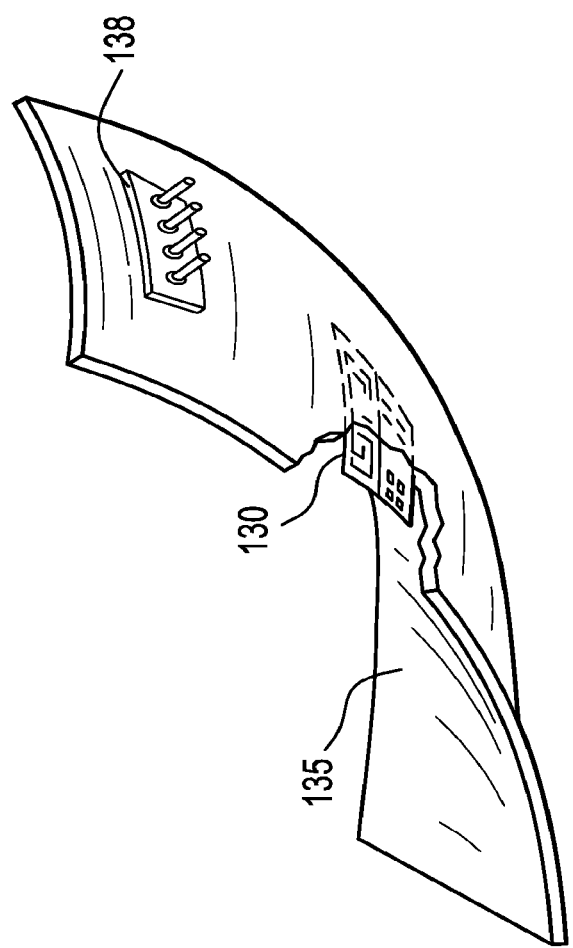
FIG. 1C shows the casing of the communication device in accordance with some embodiments described herein and illustrates the controller as enclosed within the casing.

FIG. 1C shows a casing 135 that in various embodiments encloses a controller 130 of the communication device. The casing 135 comprises connectors 138 that can, in various embodiments, be used to connect the controller 130 to the circuit of the communication device. FIG. 1C illustrates the controller 130 via a broken window region to indicate that the controller is not, in various embodiments, visible and is enclosed in the casing 135.

FIG. 1D shows a cross section of the elements of the communication device, in accordance with some embodiments, in the sensor region, comprising the inner fabric 110, conductive lines 120, a fabric spacer 143, a conductive layer 147, and a sensor identification molding 142. Also shown is an outer clothing fabric 140 that, in some embodiments, illustrates a garment to which the communication device can be attached. The conductive layer 147 can be, in various embodiments, comprised of a variety of conductive materials such as, for example, a conductive fabric. The cross-hatched regions in the conductive layer 147 and the conductive lines 120 illustrate how conduction is achieved, in various embodiments, by pressing together the conductive layer 147 to the conductive lines 120 to transmit a signal from the outer clothing fabric 140.

Figure 1E:
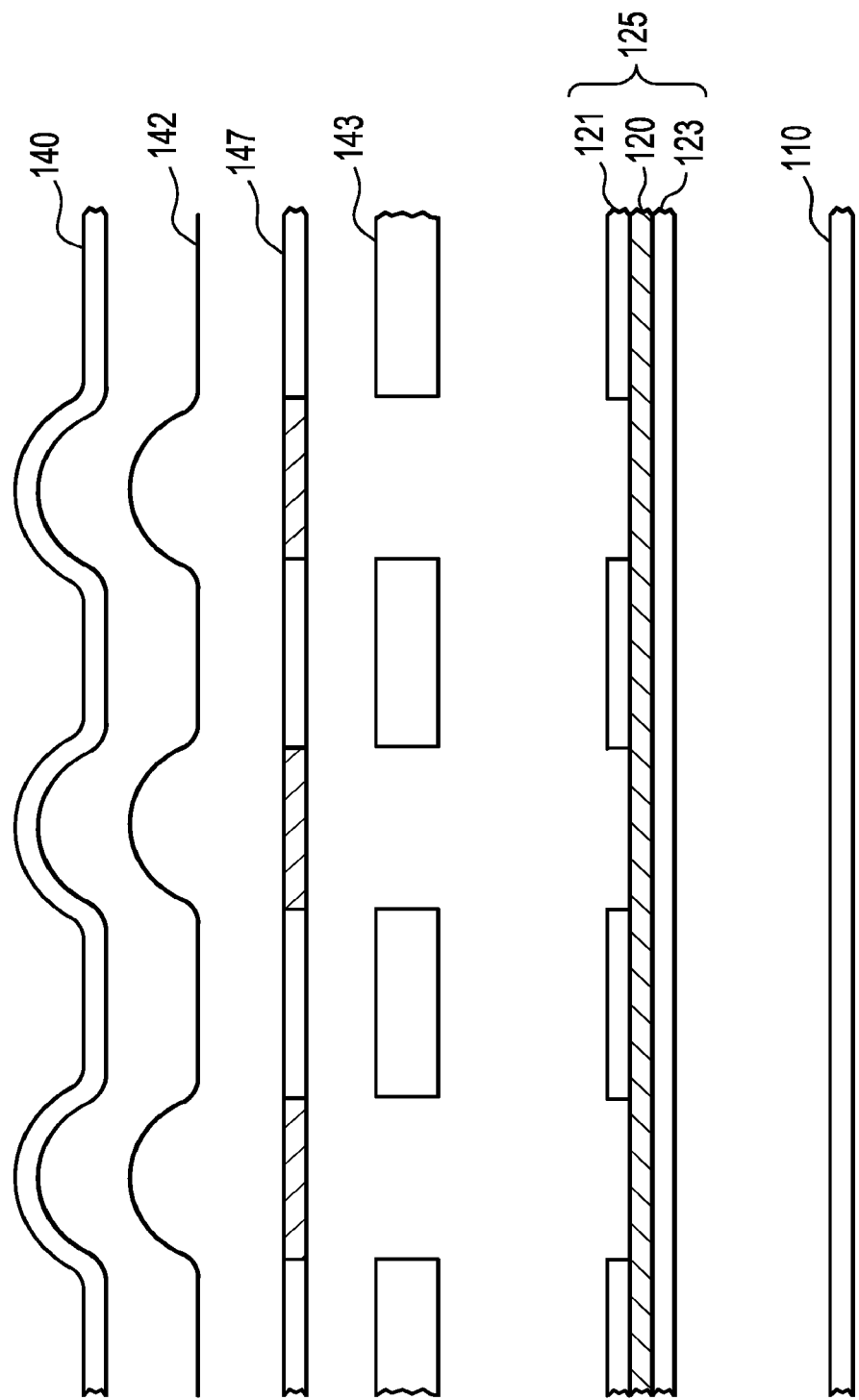
FIG. 1E illustrations a cross section of the elements of the communication devices and an outer clothing fabric that in some embodiments covers the communication device with an amalgamated flexible circuit region comprising dielectric insulation, conductive ink and thermoplastic polyurethane.

FIG. 1E shows a cross section of the elements of the communication device, in accordance with some embodiments, in the sensor region, comprising the inner fabric 110, an integrated region referred to has an amalgamated flexible circuit region 125 comprised of conductive lines 120, a dielectric insulator layer 121, and thermoplastic polyurethane 123, a fabric spacer 143, a conductive layer 147, a sensor identification molding 142. Also shown is an outer clothing fabric 140 that, in some embodiments, illustrates a garment to which the communication device can be attached. The conductive layer 147 can be, in various embodiments be, comprised of a variety of conductive materials such as, for example, a conductive fabric. The cross-hatched regions in the conductive layer 147 and the conductive lines 120 illustrate how conduction is achieved, in various embodiments, by pressing together the conductive layer 147 to the conductive lines 120 to transmit a signal from the outer clothing fabric 140.

The dielectric insulator (or insulation) 121 is, in various embodiments, integrated with the conductive lines 120, and thermoplastic polyurethane 123 to form an amalgamated flexible circuit region 125 printed, or adhering to after heat transfer, the inner fabric 110, i.e., portion of fabric 110. The sensor identification molding 142 provides, in various embodiments, a structure to identify the sensor region the sensor identification region of the outer clothing fabric. The sensor identification molding can be plastic, silicone, or other suitable material known to persons of skill in the art.

The sensor identification molding can take a variety of shapes that persons of skill in the art can use to provide for a sensor identification region tailored to user needs in various embodiments. In some embodiments the sensor identifier region 141 (See FIG. 1B) is in the form of convex or concave ridges that are, in some embodiments, not visible on the outer fabric, or item of apparel associated with the communication, but can be sensed by touch. In some embodiments the sensor identifier region 141 is in a pattern tailored to an individual user's needs and using sensor identification moldings tailored to produce these patterns. Whether the outer fabric is straight, flat, ridged, convex, concave, or other shape, is made possible by the sensor identification molding 142 which can be adapted to various shapes in accordance with designer and/or user preferences.

In some embodiments, in making the communication device, a dielectric insulator layer and conductive ink, can be printed on thermoplastic polyurethane and the thermoplastic polyurethane with dielectric insulator layer and conductive ink printed thereon can then be heat transferred or laminated to a portion of fabric.

It is understood by persons of skill in the art that a wide variety of circuits printed on a portion of fabric comprising conductive lines can be used in various designs that are in accordance with embodiments described herein and that the circuits printed on a portion of fabric described herein are non-limiting illustrative examples. In various embodiments, described herein is a communication device wherein a circuit, printed on, or adhering to, a portion of fabric that is operably connected to a controller that can be attached to the circuit, and comprises sensors for communication from an attached garment.

In some embodiments, conductive lines are comprised of conductive ink. Silver conductive ink can be used in some embodiments, for example, and can be purchased from various distributers, such as, for example Amazon, or purchased from the manufacturers directly. In some embodiments, conductive lines can be comprised of conductive thread. Thermoplastic polyurethane can be purchased, for example, from Alibaba. Various conductive fabrics can be used. Processes for preparing a circuit printed on a portion of fabric in accordance with embodiments of the communication device described herein are well known to persons of skill in the art.

Figure 1F:
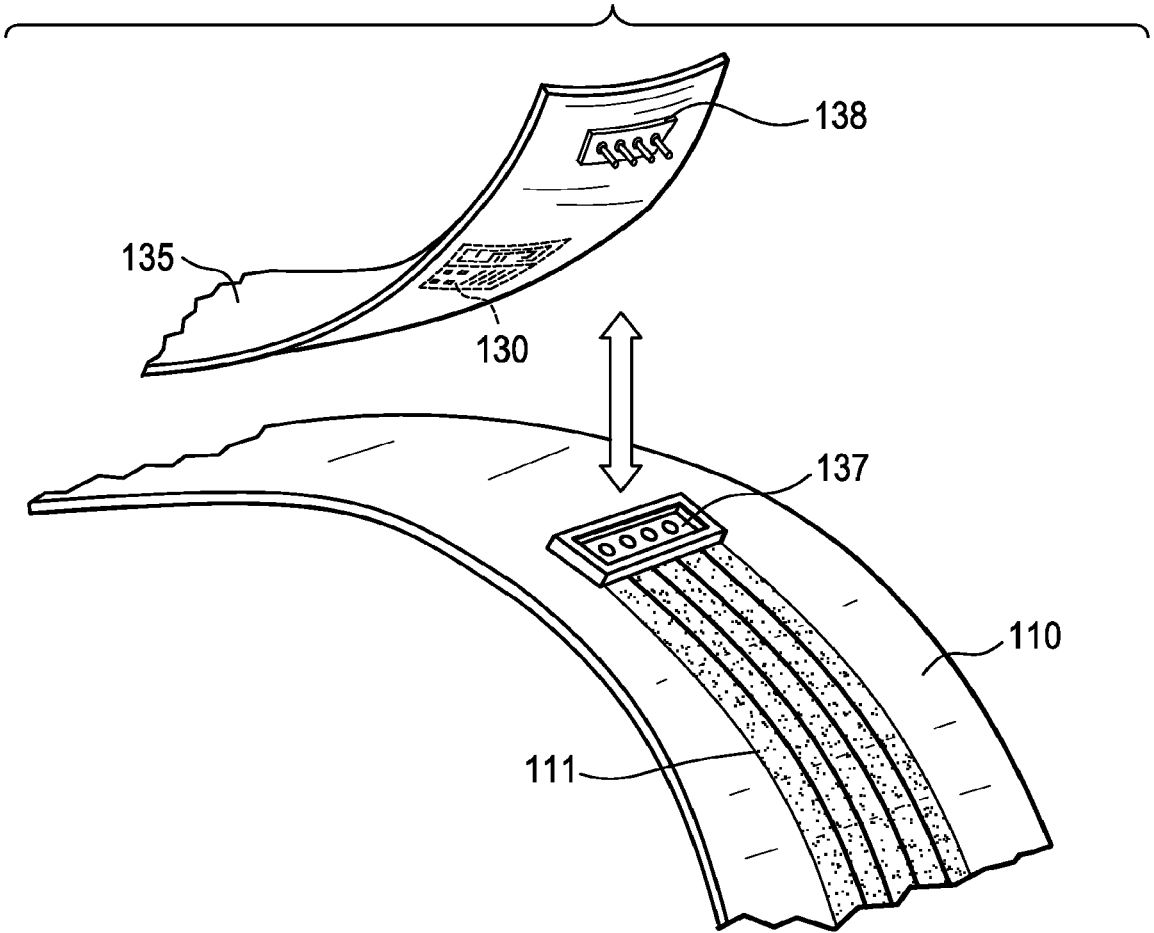
FIG. 1F illustrates how, in some embodiments, the controller can be attached to the circuit printed on portion of fabric using pogo pins.

FIG. 1F show the casing 135 is electrically attachable to the circuit printed on a portion of fabric 111 by pogo pins 138 and a pogo pin mating region 137 but any suitable means of attachment can be used if the controller 130 can be electrically coupled to the circuit printed on a portion of fabric. FIG. 1F illustrates the mechanism by which the casing 135 can be attached to the circuit using pogo pins 138 and a corresponding pogo pin mating region 137 to attach the controller 130 to the circuit 111 on a portion of fabric, inner fabric, 110.

Figure 1G:
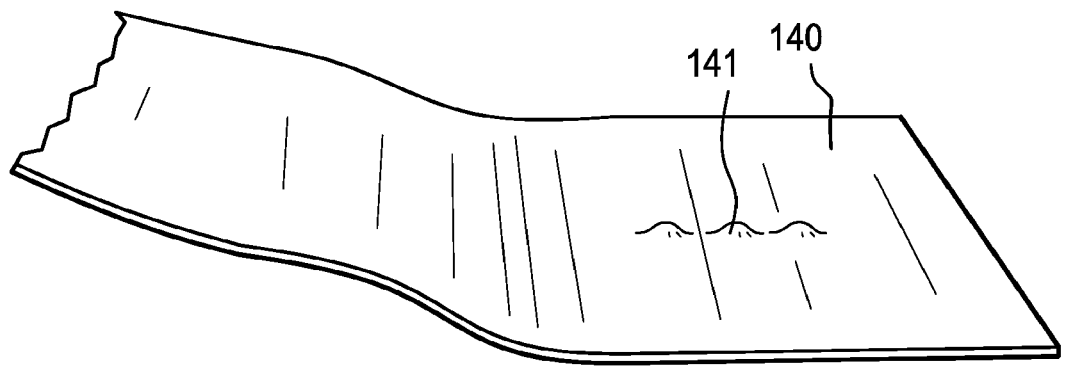
FIG. 1G illustrates the signaling regions of a communication device protruding through from the outer clothing fabric in accordance with some embodiments described here.

FIG. 1G shows the sensor identification region 141 on the outer clothing fabric 140 that, in some embodiments, enables a user to recognize where sensors are by touch through an item of apparel. This can facilitate discreet use of the communication device.

Figure 2A:
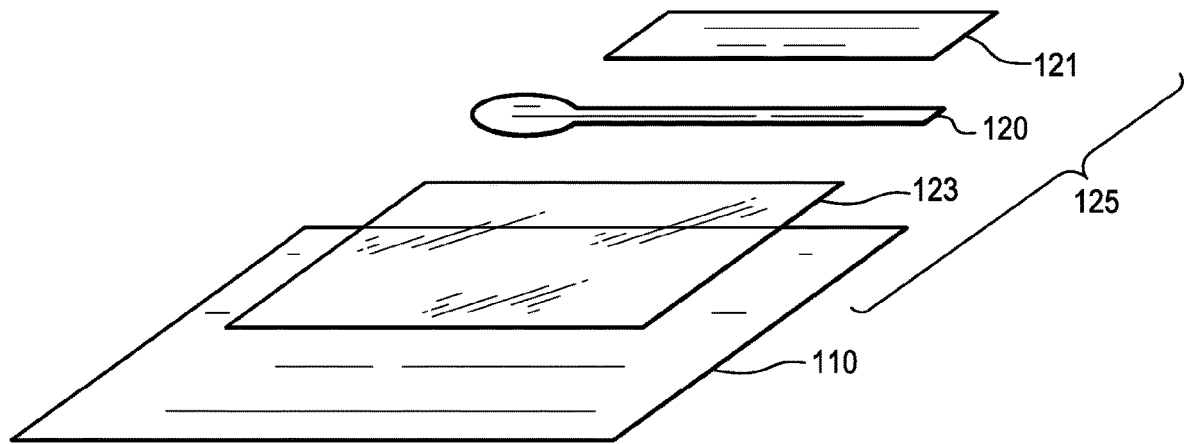
FIG. 2A illustrates the components of an amalgamated flexible circuit region on the inner fabric of the communication device in some embodiments.
Figure 2B:
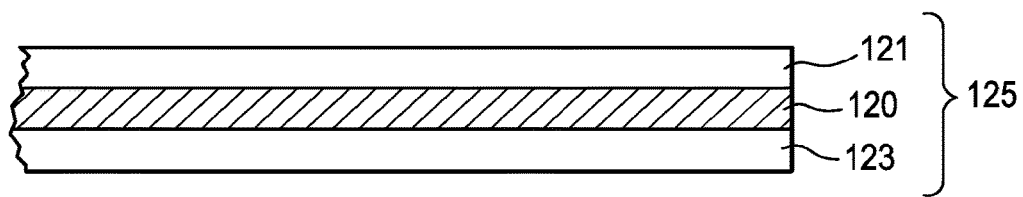
FIG. 2B is a schematic illustration of an amalgamated flexible circuit region.
Figure 2C:
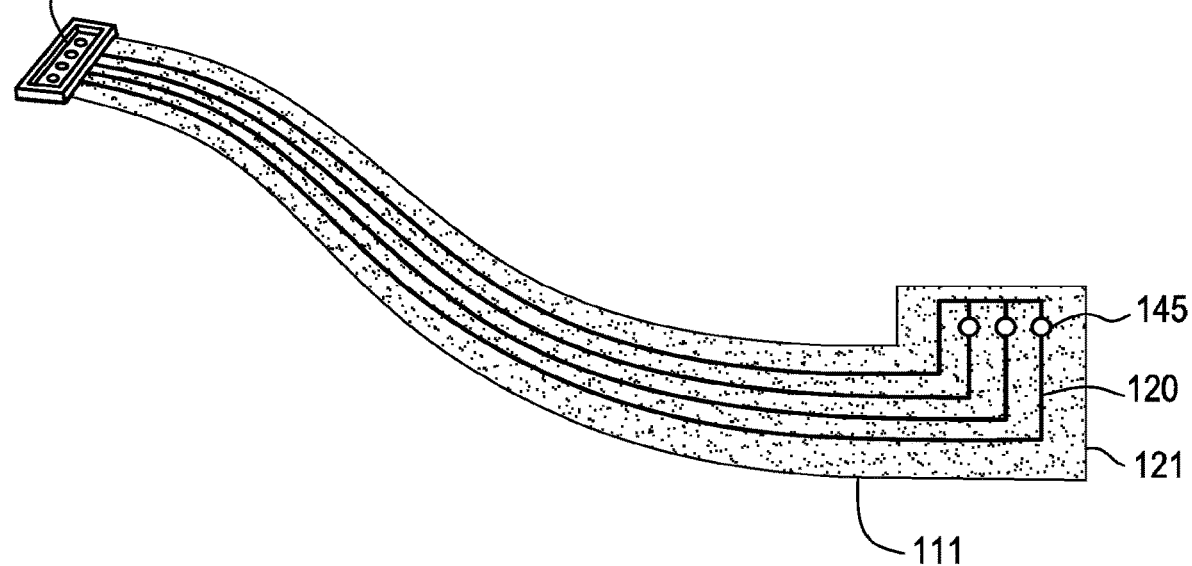
FIG. 2C shows a sensor circuit with sensor regions and pogo pin mating region for connection to the controller.
Figure 3:
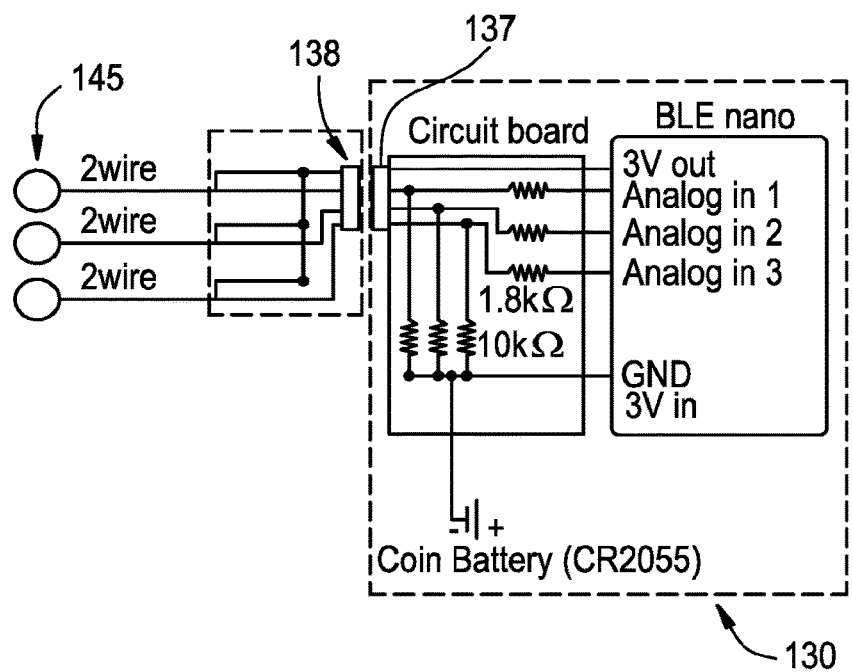
FIG. 3 illustrates the electronic system of a communication device described in some embodiments.

FIG. 2A Illustrates the components of an amalgamated flexible circuit region 125 wherein conductive ink 120, dielectric insulation 121 can be printed on a thermoplastic polyurethane 123 and then heat transferred to the portion of fabric 110 to form an amalgamated flexible circuit region adhering to, or printed to, the portion of fabric. It is understood, that persons of skill in the art would understand suitable thermoplastic polyurethanes that can be used with fabric. Moreover, other suitable thermoplastic elastomers can be used in accordance with various embodiments described herein. FIG. 2B is a schematic illustration of an amalgamated flexible circuit 125 and the components thermoplastic polyurethane 123, conductive ink 120, and dielectric insulation. FIG. 2C shows a sensor circuit 111 with sensors 145, conductive ink lines 120, a dielectric insulator 121, and a pogo pin mating region 137 for connection to a controller. [00105] FIG. 3. shows a schematic of the circuit, sensors 145, connectors 138 and 137 that connect the circuit to the controller. The portion of fabric is not shown in FIG. 3. The controller 130 illustrated in FIG. 3 comprises a circuit board, a coin battery, and a pressure sensor, input device, to the controller region, and a Bluetooth Low Energy (BLE) nano system on a chip. Persons of skill in the art understand that a variety of batteries, circuit boards, and wireless personal area network technologies, and other network technologies as described herein, can be used in various embodiments of the communication device and that the components and arrangement of FIG. 3 are only for illustrative purposes. Additional sensors, modules and circuits can be included in various embodiments of the communication device. These components, sensors and modules can be used in different combinations, omitted or included based upon need or application.

Figure 4:
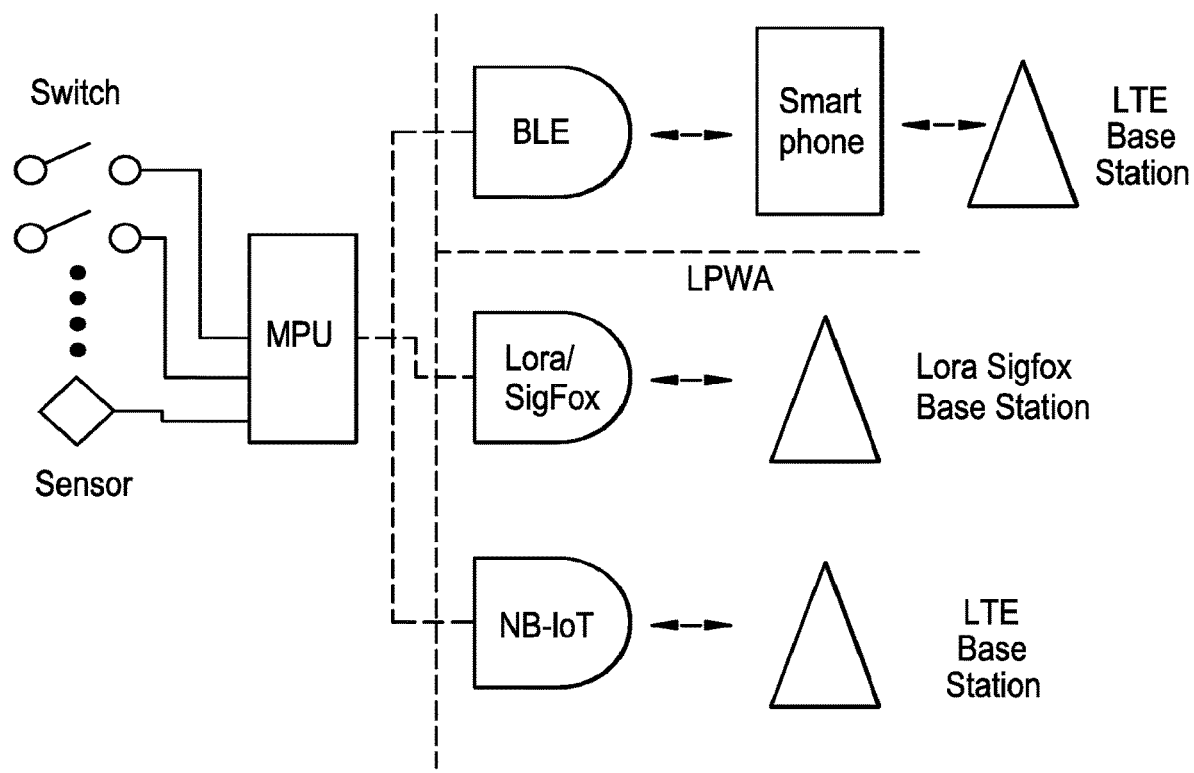
FIG. 4 illustrates the flow of information from a sensor and switch through controller elements, networks, to electronic devices.

FIG. 4 illustrates the flows of information from a sensor and switch through a controller (microprocessor), routing through various wireless network technologies, to electronic devices, such a smart phone, in accordance with some embodiments of the communication device described here. BLE (Bluetooth Low Energy) is a wireless personal area network technology. Lora and SigFox are network operators that can be used in some embodiments described herein. Narrowband IoT is a Low Power Wide Area Network radio technology that can be used to enable cellular devices and services compatible with some embodiments described herein. Persons of skill in the art understand that various networks and technologies can be used with the communication device described herein, both existing and compatible technologies that are later developed.

Figure 5:
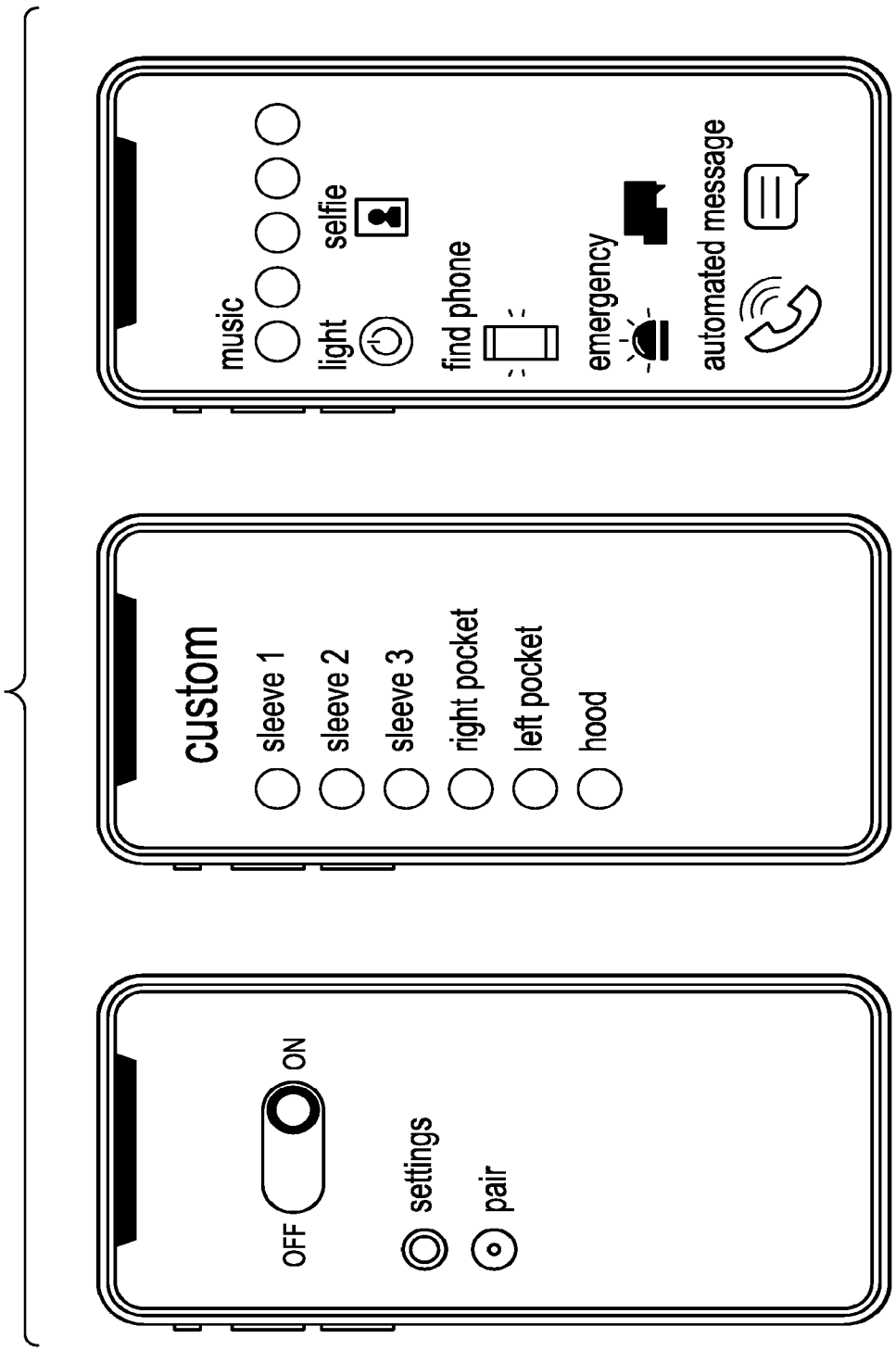
FIG. 5 illustrates an application on a smart phone and how to customize connections for interacting with a communication device described in various embodiments herein.

FIG. 5 illustrates a mobile phone application that can be used with some embodiments of the communication device described herein. The application has custom settings that can be used in conjunction with the communication device. An application can pair the communication device described herein with a mobile phone, such as is shown in FIG. 5. Various buttons and sensors can be programmed to operate with the mobile phone. Various functions can be programed for rapid interaction with the communication device such as emergency contact and preferred modes of communication. Individual users have the capacity to program their personal preferences with various embodiments of the communication device and evolving mobile/smart phone technology.

Figure 6:
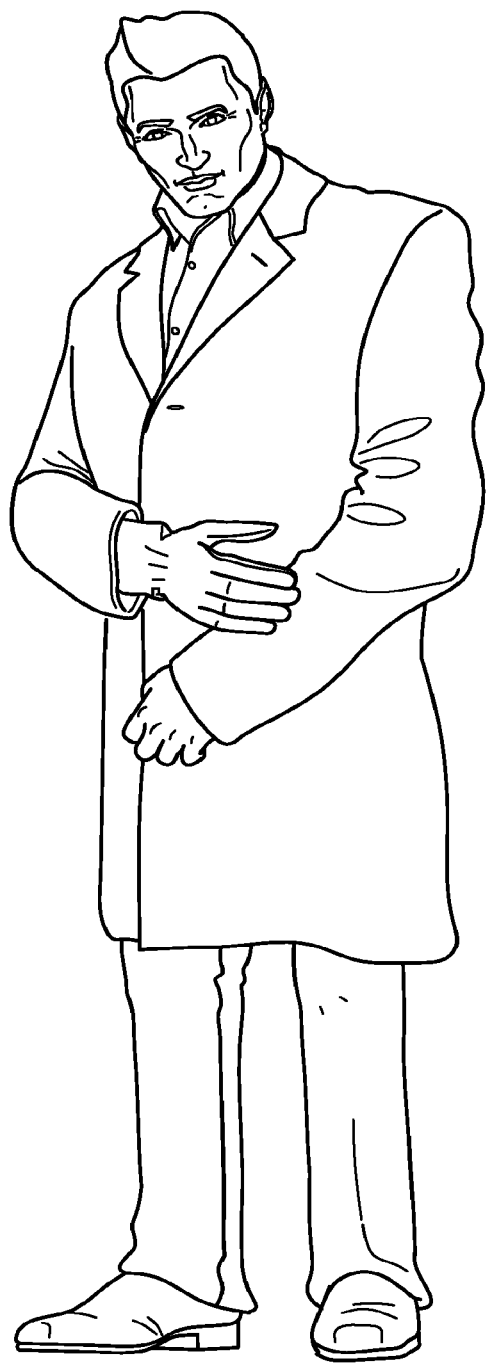
FIG. 6 illustrates a user using a communication device described in some embodiments herein by touching a sleeve region to send or receive a signal or communication.
Figure 7:
FIG. 7 illustrates a use of a communication device described in some embodiments herein by touching a hood of a jacket to send or receive a signal or communication.

FIG. 6 illustrates the communication device, not seen, attached to a sleeve of a jacket and a person is shown communicating with an electronic device from the communication device described herein by touching a sleeve, either generating or receiving a signal in accordance with some embodiments described herein. In FIG. 7A, person is shown communicating with an electronic device from the communication device described herein by touching a hood, either generating or receiving a signal, in accordance with some embodiments described herein.

In some embodiments, the communication device described herein can be tailored to be used with different items of apparel. This can be enabled by preparing the inner and outer fabric to be customized for different items of apparel. FIGS. 8A, 8B, 9A, 9B, 10A, and 10B illustrate how in some embodiments, this can be accomplished.

FIG. 8A shows the communication device implemented on a shirt pocket, and FIG. 8B shows an example of the communication device as described herein, tailored for use with a shirt pocket without the shirt. Persons of skill in the art will understand that various other implementations can be provided for use with a shirt. FIG. 9A shows the communication device implemented on a pair of pants, and FIG. 9B shows an example of the communication device described herein, tailored for use with a pair of pants without the pair of pants. In this example, the communication device is affixed to a belt. Persons of skill in the art will understand that various other implementations can be provided for use with pants.

Figure 10A:
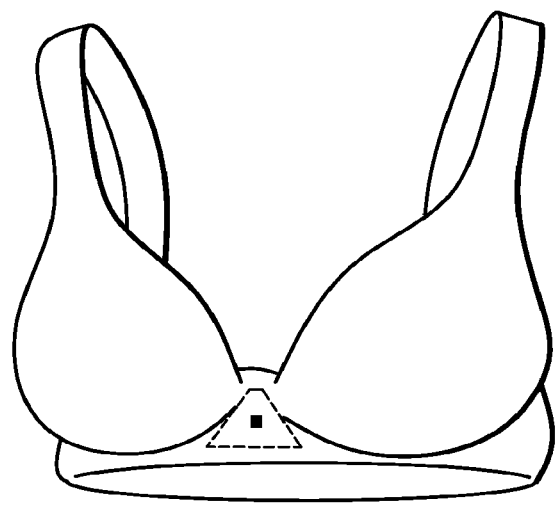
FIG. 10A shows an embodiment of the communication device described herein for use with a bra.
Figure 10B:
FIG. 10B shows the communication device of FIG. 8A without the presence of the bra.

FIG. 10A shows the communication device implemented on a bra, and FIG. 10B shows an example of the communication device described herein, tailored for use with a bra without the bra. In this example, the communication device is affixed to a pocket region at the center/convex part of the bra. Persons of skill in the art will understand that various other implementations can be provided for use with a bra or any other clothing/wearable item.

FIGS. 6 to 10 illustrate the communication device, in some embodiments, implemented in various items of clothing. Persons of skill in the art would understand that a wide range of other clothing can be used wherein the communication device can be attached and used to provide and receive signals to and from a user.

Users will intuitively recognize how to use the communication device to transmit and receive signals in various embodiments. For example, a user can send a signal to an electronic device, such as a mobile phone, by interacting with the device across a clothing item, as shown, for example, in the FIGS. 6 to 10, where the communication device is shown depicted on various items of clothing. FIG. 6 illustrates the concept. In FIG. 6, a user is shown touching a jacket sleeve and either generating or receiving a signal in accordance with some embodiments described herein. The communication device is not visible since it is attached, in various embodiments, inside the sleeve. To send a signal, in the example of a jacket sleeve, a user makes contact with the device in an input region 141, see FIG. 1A for reference, via, in some examples, a touch pad, which in this example could be a fabric touch pad. The input region 141, as described herein, comprises, in some embodiments, sensors 145, and can in various embodiments known to persons of skill in the art comprise touchpads, switches, buttons, or any device, including measuring skin conduction, in which a signal can be transmitted from the input region to the sensors 145. On creating a signal in the input region, the signal is then transmitted to an electronic device, such as a mobile phone, via the controller 130. Another person can then receive the signal at the electronic device to which the signal has been transmitted. The other user, or any third party, can also send a signal to the user from an electronic device, such as a mobile phone, by transmitting a signal to the communication device through the controller 130 to the user, where in FIG. 6, for example, the user can receive signals at the jacket sleeve.

In various embodiments, a person of skill in the art understands that the communication device can be used in an interactive manner discretely generating and receiving communications from a user to and from an electronic device, or computing device, that may or may not be operated by another user. Touch input at the communication device input region can transmit a signal to an electronic device, or computing device, via a circuit printed on a portion of fabric 111 through a controller 130 and another user can transmit signals to the communication device from the electronic or computing device such as a mobile phone as schematically illustrated in various embodiments in FIG. 4.

In some embodiments, the means for transmitting electric signals comprises a region of the circuit printed on a portion of fabric configured to transmitting electrical signals to and from a user. In some embodiments, the region of the circuit printed on a portion of fabric configured for transmitting electrical signals to and from a user is referred to as a sensor identification region 141. A variety of sensors can be used. In some embodiments, sensors can be selected from pressure sensors, capacitive sensors, temperature sensors, body sensors, motion sensors (such as an accelerometer, gyroscope, force, bit or vibration, and the like), ultrasonic sensors, image sensors, heartbeat sensors, pulse sensors, GPS sensor and module, GSM, or NFC, or combinations thereof. The sensor identification region can, in some embodiments, be operably connected to a switch, sensors, antennas, biosensors, touch screens, switch pad, touch pad, touch switches, printed heaters, or combinations thereof. The communication device 100 can process a touch-input from the circuit printed on fabric 111 and process the input through the controller 130 to communicate with an electronic device. The circuit is configured, in some embodiments, to sense touch input from a user when one or more fingers of the user's hand touch the circuit 111 via the sensor identification region 141 through the sensors 145. In some embodiments, the touch region is in a defined space of the circuit. In some embodiments, a touch pad region is used with two or more input buttons. In some embodiments a touch pad provides the means for accepting electrical signals on the circuit in response to touch. In some embodiments, the electric signals convert messages entered by a user of the communication device described.

The means for attaching the circuit printed on the portion of fabric to an item of apparel, or attachment means, can be any method or means known in the art such as magnets, zippers, snaps, magnetic snaps, Velcro®, buttons, gluing, taping, mounting, pinning, pogo pins, enclosing, encapsulating, hooks, pins, latches, hook systems, any latch or hook system with complementary elements on the device and item to be attached to, any other method known in the art, or combinations thereof.

The controller can be attached to the sensing circuit by one or more pogo pins, magnets, a zipper, snaps, magnetic snaps, buttons, or combinations thereof. In some embodiments, the communication device is configured to collect biometric data. In some embodiments, the biometric data collected can be transmitted directly to a medical professional.

When the stimulus output producing device is configured to generate a tactile sensation, preferably the device comprises a motor, e.g., a vibration motor such as a pancake vibration motor or linear actuator or off-center motor. The motor may, for example, be configured to generate a single type of vibration or pulsation or to generate a plurality of types of vibrations and/or pulsations that vary based on pattern and/or intensity or other parameter.

In some embodiments, the systems and devices disclosed herein may notify a user of his or her physical surroundings, e.g., physical location as determined by a GPS protocol through the use of a GPS tracking unit and software located on the mobile communication device or on a device or network coupled to the mobile communication device.

Computer programs, software, can be used, in some embodiments, for analyzing inputs and received information from electronic devices, for generating a stimulus, for receiving locally generated or collected information, and for transmitting locally generated or collected information to a remote location such as an electronics or telecommunication device. Artificial intelligence can be implemented to, in some embodiments, update the communication device and connected clothing system to evolve in accordance with user preferences.

In embodiments where software is used, the software can be upgraded via a number of data transmission techniques known to the art, including, but not limited to, USB, FireWire, Bluetooth (e.g., Bluetooth Low Energy BT 4.0), and WiFi.

In some embodiments, if the communication device is out of range (i.e., disconnected from the electronic device or beyond a specific distance range, the user can be alerted through vibration or light patterns. In some embodiments, the user can be notified when the device is within a specific distance. This feature will indicate to the user that he/she is far away from the communication device and may have left it behind or it was stolen.

The communication device can also be configured to be context aware. The communication device can recognize, for example, when a user is at a specific location and then adjust the distance to which the user will be alerted by a user being out of range. In some embodiments, the communication device uses artificial intelligence to synchronize with the needs and habits of the user.

In some embodiments, the communication device can be in communication with an electronic device in order to monitor incoming communications, including, but not limited to, alerts of a telephone call. Thus, the communication device can, in some embodiments, be in communication with software on a mobile phone and/or smartphone, including, but not limited to, a specially designed application, to identify incoming calls via an application program interface, for example.

In some embodiments, a user can determine which stimulus or combination of stimuli to associate with what type of communication and from whom. These determinations may be made by a user through software designed to permit these associations to be made. Software can, in some embodiments, be designed to allow users to select whether communications from a plurality of third-parties (e.g., contacts) and/or a plurality of types may be associated with the same stimulus alert. For example, e-mail notifications can be associated with a vibration stimulus and voicemail can be associated with an auditory stimulus. In some embodiments, the communication device can be configured to provide for stimulus differentiation based on the content of the original communication such that, for example, an urgent message can be treated differently than a non-urgent one.

In some embodiments, software can communicate with a remote transmitting device's wireless communication interface and instruct the interface to send a caller's unique notification to the communication device. For example, a remote transmitting device's Bluetooth interface can convey a unique notification to the Bluetooth interface of a communication device in accordance with some embodiments. The mobile communication device and the remote transmitting device may communicate wirelessly over the Bluetooth protocol via radio frequency transmission and reception, and thus can communicate when within a range for which Bluetooth communications are possible.

In some embodiments, the communication device disclosed herein, and the connected clothing system can search for incoming communications using the wireless communications interface in the communication device. The software integrated into the communication device can receive a transmitted unique notification and generate a stimulus or stimuli on the mobile communication device's output interface. Those skilled in the art will recognize that the transmission of notifications between the communication device and various telecommunication devices can be accomplished using a variety of different wireless communication protocols depending on the needs of the user and that the process of communicating a notification of an alert to the communication device can be used for alerts of many types of communications, including, for example, text messages, picture messages, application notifications, proximity notifications and phone notifications, such as low battery or data.

The foregoing descriptions have been presented for purposes of illustration and description. They are not exhaustive and do not limit the invention to the precise form disclosed. Modifications and variations are possible in light of the above teachings or may be acquired from practicing of the invention. For example, the described implementation includes certain electronic devices, but it is understood that other electronic devices can be implanted with the communication device described in various embodiments.

Additional embodiments will be apparent to those skilled in the art from consideration of the specification and practice communication device and systems disclosed herein. Other changes, substitutions, and alterations are also possible without departing from the spirit and scope of this disclosure.

Various embodiments are described in this specification, with reference to the detailed discussed above, the accompanying drawings, and the claims. Numerous specific details are described to provide a thorough understanding of various embodiments. However, in certain instances, well-known or conventional details are not described in order to provide a concise discussion. The figures are not necessarily to scale, and some features may be exaggerated or minimized to show details of particular components. Therefore, specific structural and functional details disclosed herein are not to be interpreted as limiting, but merely as a basis for the claims and as a representative basis for teaching one skilled in the art to variously employ the embodiments.

The embodiments described and claimed herein and drawings are illustrative and are not to be construed as limiting the embodiments. The subject matter of this specification is not to be limited in scope by the specific examples, as these examples are intended as illustrations of several aspects of the embodiments. Any equivalent examples are intended to be within the scope of the specification. Indeed, various modifications of the disclosed embodiments in addition to those shown and described herein will become apparent to those skilled in the art, and such modifications are also intended to fall within the scope of the appended claims.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

All references, including patents, patent applications and publications cited herein are incorporated herein by reference in their entirety and for all purposes to the same extent as if each individual publication or patent or patent application was specifically and individually indicated to be incorporated by reference in its entirety for all purposes.

What is claimed is:

1. A connected clothing system comprising: a communication device comprising a circuit printed on a portion of fabric, the circuit comprising: an amalgamated flexible circuit region; one or more sensors; and one or more conductive connectors; a casing comprising an interior region and one or more conductive connectors capable of connecting with the one or more conductive connectors of the circuit; a controller enclosed within the interior region of the casing; and an item of apparel attached to the communication device.

2. The connected clothing system of claim 1, wherein the amalgamated flexible circuit region of the communication device comprises conductive lines.

3. The connected clothing system of claim 2, wherein the conductive lines comprise conductive ink or conductive thread.

4. The connected clothing system of claim 3, wherein the conductive lines comprise silver conductive ink.

5. The connected clothing system of claim 1, wherein the circuit comprises a dielectric insulator.

6. The connected clothing system of claim 1, further comprising input means operably connected to the controller.

7. The connected clothing system of claim 6, wherein the input means is a touch pad.

8. The connected clothing system of claim 7, wherein the touch pad is a fabric touch pad.

9. The connected clothing system of claim 1, wherein the communication device comprises a means for attaching the communication device to the item of apparel.

10. The connected clothing system of claim 9, wherein the means for attaching the communication device to the item of apparel is selected from the group consisting of: magnets, zippers, snaps, magnetic snaps, hook-and-loop fasteners, buttons and combinations thereof.

11. The connected clothing system of claim 1, wherein the controller is detachable from the circuit.

12. The connected clothing system of claim 1, wherein the controller comprises a power source, a microprocessor, and a network interface.

13. The connected clothing system of claim 12, wherein the network interface is an antenna.

14. The connected clothing system of claim 1, wherein the controller comprises a flexible printed circuit board.

15. The connected clothing system of claim 1, wherein the casing is attached to the circuit via the respective one or more conductive connectors.

16. The connected clothing system of claim 1, wherein the one or more conductive connectors are pogo pins, magnets, a zipper, snaps, magnetic snaps, or combinations thereof.

17. The connected clothing system of claim 1, wherein the fabric is a textile.

18. The connected clothing system of claim 1, wherein the fabric is an artificial leather.

19. The connected clothing system of claim 1, wherein the communication device comprises a sensor identification molding.

20. The communication device of claim 19, wherein the sensor identification molding comprises one or more convex or concave configurations.

\* \* \* \* \*